(12) United States Patent
Sugitani et al.

(10) Patent No.: US 8,163,635 B2
(45) Date of Patent: Apr. 24, 2012

(54) MANUFACTURING METHOD OF SEMICONDUCTOR DEVICE

(75) Inventors: Michiro Sugitani, Ehime (JP); Genshu Fuse, Osaka (JP)

(73) Assignee: Sen Corporation, Tokyo (JP)

( * ) Notice: Subject to any disclaimer, the term of this patent is extended or adjusted under 35 U.S.C. 154(b) by 0 days.

(21) Appl. No.: 12/962,035

(22) Filed: Dec. 7, 2010

(65) Prior Publication Data

US 2011/0136329 A1 Jun. 9, 2011

(30) Foreign Application Priority Data

Dec. 7, 2009 (JP) ................................ 2009-277828

(51) Int. Cl.
   *H01L 21/01* (2006.01)
   *H01L 21/425* (2006.01)
   *H01L 21/84* (2006.01)
(52) U.S. Cl. ........ 438/510; 438/514; 438/495; 438/499; 438/501; 438/505; 257/E21.334; 257/E21.336; 257/E21.345
(58) Field of Classification Search ........... 257/E21.334, 257/E21.335, E21.336, E21.345
See application file for complete search history.

(56) References Cited

U.S. PATENT DOCUMENTS

| 3,562,022 | A | 2/1971 | Shifrin et al. | |
| 7,226,846 | B2 * | 6/2007 | Takahashi | 438/425 |
| 7,524,743 | B2 | 4/2009 | Gupta et al. | |
| 2002/0055240 | A1 * | 5/2002 | Naseem et al. | 438/502 |
| 2005/0040440 | A1 * | 2/2005 | Murakami | 257/225 |
| 2007/0084564 | A1 | 4/2007 | Gupta et al. | |
| 2007/0087574 | A1 | 4/2007 | Gupta et al. | |

FOREIGN PATENT DOCUMENTS

| EP | 2 330 614 A2 | 6/2011 |
| JP | 54-149463 A | 11/1979 |
| JP | 61-17134 B2 | 5/1986 |
| JP | 62-142318 A | 6/1987 |
| JP | 63-229713 A | 9/1988 |
| JP | 2004-095835 A | 3/2004 |
| JP | 2008-53725 A | 3/2008 |
| JP | 4302952 B2 | 5/2009 |
| JP | 2009-182360 A | 8/2009 |

* cited by examiner

*Primary Examiner* — Mohsen Ahmadi
(74) *Attorney, Agent, or Firm* — Arent Fox, LLP (57) ABSTRACT

A manufacturing method of a semiconductor device includes preparing a semiconductor substrate which is a base substrate of the semiconductor device and which is formed with a concavity and convexity part on the surface of the semiconductor substrate. The method further comprises depositing on the surface of the semiconductor substrate an impurity thin film including an impurity atom which becomes a donor or an acceptor in the semiconductor substrate and performing an ion implantation from a diagonal upper direction to the impurity thin film deposited on the concavity and convexity part of the semiconductor substrate. The method still further comprises recoiling the impurity atom from the inside of the impurity thin film to the inside of the concavity and convexity part by performing the ion implantation.

14 Claims, 9 Drawing Sheets

MANUFACTURING METHOD OF SEMICONDUCTOR DEVICE

This application is based upon and claims the benefit of priority from Japanese patent application No. 2009-277828, filed Dec. 7, 2009, the disclosure of which is incorporated herein in its entirety by reference.

BACKGROUND OF THE INVENTION

The present invention relates to a manufacturing method of a semiconductor device and, in particular, relates to a doping method of an impurity atom to a semiconductor substrate.

Figure 3A:
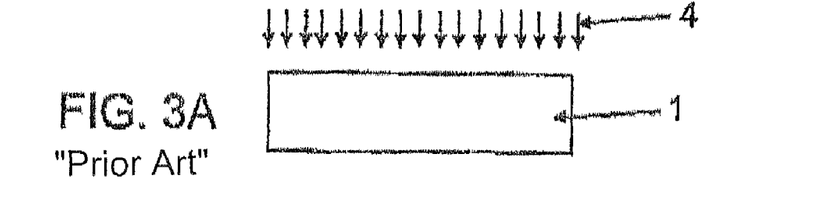
FIGS. 3A and 3B are diagrams for explaining a first example of the conventional ion implantation method.
Figure 3B:
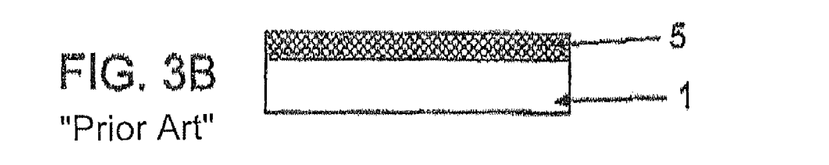

FIGS. 3A and 3B show a conventional shallow doping process for a planer semiconductor substrate 1 so as to have a junction depth of around 20 nm.

By irradiating a low energy ion beam 4, ton implantation is usually performed to the surface of the semiconductor substrate 1 at a perpendicular implantation angle or a nearly perpendicular implantation angle (FIG. 3A). For example, in case where the ion implantation is carried out by implantation energy of 200 eV, because the beam current value in the ion implantation is low, the ion implantation for an impurity diffused layer 5 needs a long implantation processing time to get a predetermined implantation dose amount (FIG. 3B).

Figure 4A:
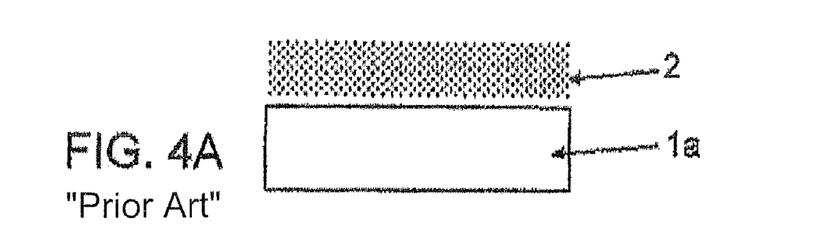
FIGS. 4A to 4C are diagrams for explaining a second example of the conventional ion implantation method.
Figure 4B:
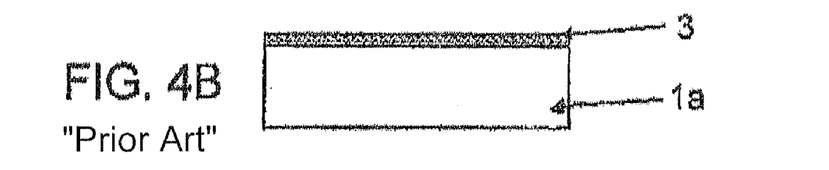
Figure 4C:
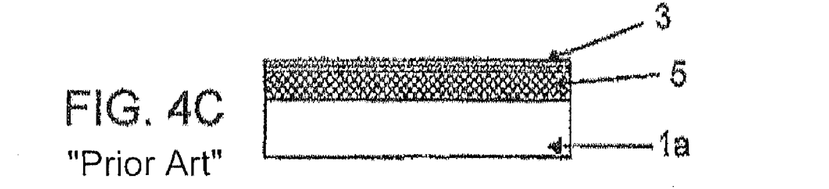

Referring to FIGS. 4A to 4C, by using a silicon substrate 1a as a semiconductor substrate, a thin film 3 is formed on the silicon substrate 1a surface with a plasma 2 including the impurity atom [chemical vapor deposition (CVD) method or physical vapor deposition (PVD) method] (FIGS. 4A and 4B). Thereafter, an impurity diffused layer 5 is formed by thermally diffusing the impurity atom such as B (Boron) from the thin film 3 within the silicon substrate is with a heat treatment (FIG. 4C).

In this case, because there is a natural oxide film on the surface of the substrate, the surface of the substrate does not become the high impurity concentration. Therefore it is hard to carry out a thermal diffusion to enough concentration as source/drain.

Figure 5:
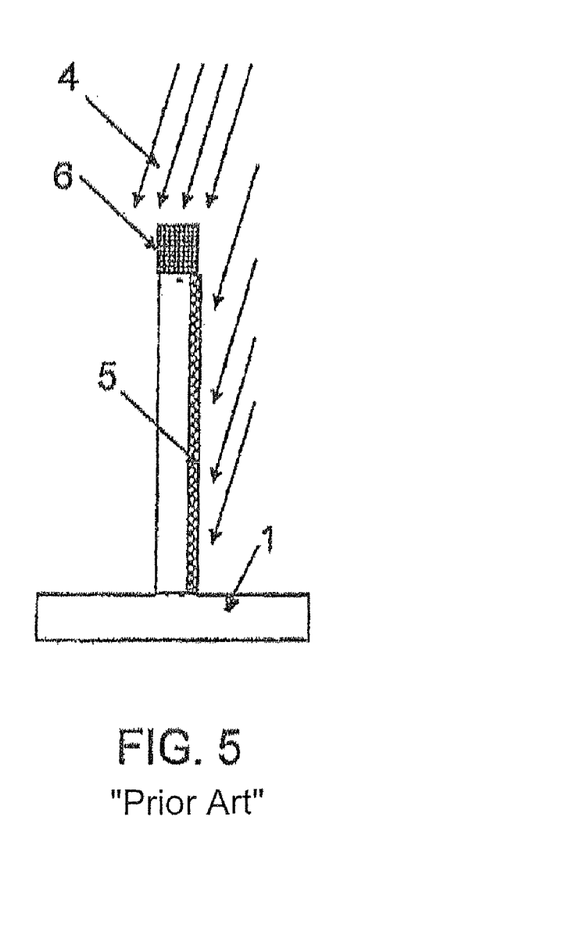
FIG. 5 is a diagram in case where a concavity and convexity part is formed by processing on a semiconductor substrate surface, and then ion implantation is carried out to the side (a wall and a slope part) of a formed concavity and convexity part.

FIG. 5 shows a conventional technique about a case that the ion implantation is carded out to the side (a wall and a slope part) of a concavity and convexity part of the semiconductor substrate formed by processing. Here, the concavity and convexity part represents a space structure having a projection, a ditch, a step, a slope, and the like.

In a process 1, a semiconductor substrate 1 for Fin-FET type transistors having the projection is made by selectivity performing etching by the use of a mask 6. In a process 2, the ion is implanted into the projection with irradiating an ion beam 4 including impurity atoms B from a diagonal course. Thereafter the heat-treatment is carried out. As a result, a diffused layer 5 of the impurity atom is formed to a sidewall of the projection.

In case where the ion implantation angle (Tilt angle) from a perpendicular line is small, e.g., in the case of 10 degrees, it is necessary to process it with an implantation dose amount of 6 times in comparison with the case for the plane. Therefore, a very long implantation processing time is necessary regardless of an advantageous condition that a beam current density level is low. This is lack in practical utility.

Besides, by a reflection of the implantation ion in the substrate surface, a loss of the implantation ion is occurred, and therefore more dose amount is needed.

As mentioned above, in the above conventional method, the ion implantation of low energy is necessary to form a shallow impurity diffused layer Into the silicon substrate. And, in the ion implantation of the low energy, it is impossible to obtain a high beam current density because of an ion beam divergence phenomenon caused by a space-charge effect. Therefore, in the low energy ion implantation of the dose amount which is near to 1E15atoms/cm2, a very long implantation processing time is required for the ion implantation. Further, a great cost up in manufacturing was caused.

As another disadvantage, like a Fin-FET type transistor of the three-dimensional structure that becomes the topic in recent years, the shallow ion implantation is necessary for a wall of the nearly perpendicular projection that was formed three-dimensionally to the silicon substrate.

Figure 10:
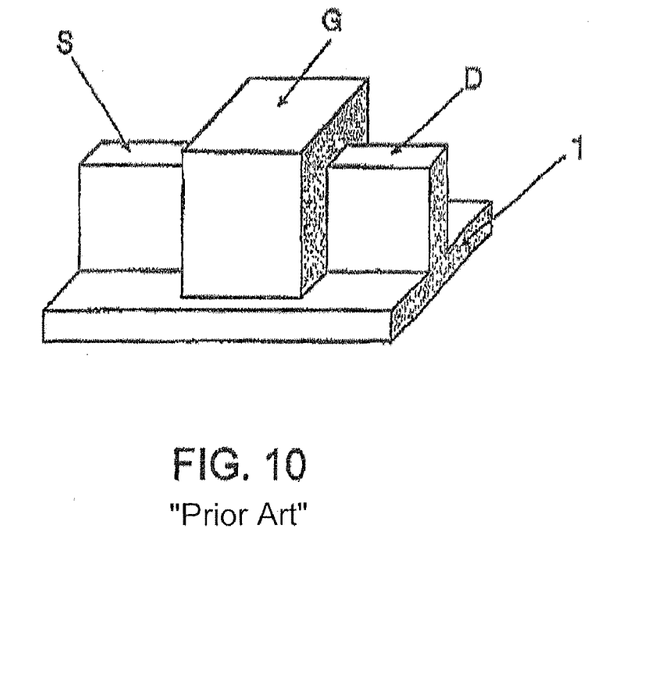
FIG. 10 is a perspective view for explaining a Fin-FET type transistor.

The Fin-FET type transistor will be described with reference to FIG. 10. On the semiconductor substrate 1, a projection (extension) which becomes a drain D, a channel, and a source S is formed by etching process or the like. A part which becomes a gate G is formed so as to cover over the channel between the source and the drain.

In the shallow ion implantation for the wall of the nearly perpendicular projection of the Fin-FET type transistor having the three-dimensional structure, when an ion implantation is performed directly, the implantation angle θ is a high angle to the wall of the projection. Therefore, the ions are implanted into the silicon substrate with only the dose amount defined by sinθ. Therefore the ion implantation of higher dose amount was necessary, and a problem has occurred in practical utility.

In addition, as shown in FIGS. 4A to 4C, there is a method for diffusing an impurity atom within the silicon substrate 1a by a thermal diffusion processing after the thin film 3 including the impurity atom has formed with the plasma 2. In this method, it is difficult to carry out the thermal diffusion more than 1E18cm-3 in the recent process that high temperature heat-treatment is impossible. For the reason, there was not useful means that can realize a Fin-FET type transistor.

Furthermore, with the miniaturization of the LSI device, the implantation of the impurity atom to the region which is called the extension of the source/drain region becomes more shallow. However, the amount of the implanted impurity atom remains with an approximately constant value. On the other hand, in a conventional ion implantation technology, the energy of the ion beam falls down as the implantation depth becomes shallow. Therefore the beam current deteriorates under the influence of the space-charge effect, and the productivity also deteriorates.

In order to avoid this problem, a existing plan for reduction or restraint of the following substantial space-charge effect is proposed, and is put to practical use.

(1) The technique that uses the electron in the conventional beam transport system.

(2) The technique that transports the ion beam with high energy and decelerates it just before a wafer.

(3) Technique that ionizes polyatomic molecule and transports it.

In addition, in substitution for a conventional beam line type ion implantation, (4) the technique which is called a plasma doping is examined. However, none of the above-mentioned techniques is yet fixed as the technique to improve the productivity crucially.

The further miniaturization (or shrink) of the LSI device promotes the shape change of the transistor, and a space structure which is so-called 3D is being adopted. In this case, as for the ion implantation to source/drain, the doping to the surface that is perpendicular to the plane of the semiconductor substrate is required. In this event, the ion implantation of the small angle with a normal line of a perpendicular surface is impossible because the distance between adjacent transistors cannot be secured enough. For the reason, two following problems are caused from the viewpoint of the productivity. Then the problem that the productivity decreases far than a case of a planar transistor happens.

The first problem is a simple geometric problem. Only the implantation particles of the number defined by the angle that $\sin\theta$ was multiplied by the implantation angle $\theta$ arrive at a perpendicular surface of the transistor having the space structure. Generally, the efficiency of the implantation becomes equal or less than 34% because the implantation angle $\theta$ is equal or less than 20 degrees. That is the productivity of this process becomes equal or lower than one third.

As for another problem, in the ion implantation of the low-energy/low-implantation angle, the ion is reflected at the substrate surface and is hard to implant into the substrate. Therefore the degradation of the productivity occurs. At the implantation angle equal or less than 20 degrees, only the ions of 67% are implanted, therefore the productivity becomes two-thirds.

If the above two problems are joined, in the low angle implantation to the perpendicular surface, only the productivity of 2/9, namely, equal or less than 22%, can be achieved in comparison with the implantation to the plane. Accordingly, the low productivity that becomes the problem in the current planer transistor will turn worse more than around 5 times or more,

SUMMARY OF INVENTION

The present invention, by separating an ion implantation-related process into two processes, aims to obtain the effect like the one process in the ion implantation of the normal high angle with the higher productivity.

Specifically, the present invention aims to provide a method which can dope a carrier impurity atom (namely, the impurity atom that becomes a donor or an acceptor) of high concentration with high time efficiency, the normal ion implantation process time, and low energy, in comparison with the conventional method that is the ion implantation process which needs the long processing time bemuse of the low-energy ion implantation caused by the deterioration of the beam current by the space-charge effect.

The present invention also alms to provide a method which can dope impurities, with high efficiency, to a part which is not a plane of a semiconductor substrate, namely, to a wall surface part of a concavity and convexity part formed by processing on the semiconductor substrate surface. In addition, as the concavity and convexity part formed by processing on the semiconductor substrate surface, it is applicable to, in addition to en extension part and a convex part of a Fin-FET type transistor shown in FIG. 10, a wall surface part of a recessed part of a trench region and a capacitor region.

In the first process among the two processes mentioned above, a thin film including a purpose impurity atom is formed on the semiconductor substrate surface. In the next process, the ion which is heavier than the purpose impurity atom is implanted from the upper side of the thin film. As a result, the purpose impurity atom is flicked (knocking on-effect) and then implanted into the semiconductor substrate surface and further recoiled. Thus, it is possible to implant the purpose impurity atom within the semiconductor substrate.

According to an example of the present invention, in a surface of a projection part formed by the processing of a silicon substrate which becomes a base substrate of a semiconductor device, an impurity thin film including an impurity atom that is a carrier impurity atom which becomes a donor or acceptor is formed onto a surface of the silicon substrate with a plasma treatment. Then the impurity atom is recoiled from the inside of the impurity thin film to the inside of the projection part of the silicon substrate by implanting an ion from a diagonal upper direction to the impurity thin film. That is the impurity ion is introduced into the inside of the silicon substrate by utilizing a recoil action according to a knock on effect in the ion implantation.

Aspects of this invention are enumerated as follows.

(First Aspect)

A manufacturing method of a semiconductor device comprising;

preparing a semiconductor substrate which is a base substrate of the semiconductor device and which is formed with a concavity and convexity part on the surface of the semiconductor substrate;

depositing on the surface of the semiconductor substrate an impurity thin film including an impurity atom which becomes a donor or an acceptor in the semiconductor substrate;

performing an ion implantation from a diagonal upper direction to the impurity thin film deposited on the concavity and convexity part of the semiconductor substrate; and recoiling the impurity atom from the inside of the impurity thin film to the inside of the concavity and convexity part of the semiconductor substrate by performing the ion implantation.

(Second Aspect)

In the manufacturing method according to the first aspect, a dose atomic weight corresponding to an implantation dose amount is controlled by an adjustment of a film thickness of the impurity thin film or a species of an impurity deposition material of the impurity thin film, or an adjustment of an implantation ion species, an implantation angle, an implantation energy, and an implantation dose amount.

(Third Aspect)

In the manufacturing method according to the first aspect, the impurity atom of the impurity thin film is any one of B, P, and As.

(Fourth Aspect)

In the manufacturing method according to the first aspect, as the impurity thin film, the impurity thin film including B is deposited by performing a plasma treatment with a gas including diborane B2H6 or BF3.

(Fifth Aspect)

In the manufacturing method according to the first aspect, as the impurity thin film, the impurity thin film including P is deposited by performing a plasma treatment with a gas including phosphine PH3.

(Sixth Aspect)

In the manufacturing method according to the first aspect, as the impurity thin film, the impurity thin film including As is deposited by performing a plasma treatment with a gas including arsine AsH3.

(Seventh Aspect)

In the manufacturing method according to the first aspect, an implantation ion in the ion implantation process is the ion of a heavy atom which is larger in atomic weight than any one of B, P, and As which constitute the impurity atom of the impurity thin film.

(Eighth Aspect)

In the manufacturing method according to the first aspect, an implantation ion in the ion implantation process is any one of Si, As, Ge, In, Sb, Xe, and Ar.

(Ninth Aspect)

In the manufacturing method according to the second aspect, a beam incidence angle to the surface of the concavity and convexity part of the semiconductor substrate from the diagonal upper direction in the ion implantation is an inclination angle substantially less than 20 degrees.

(Tenth Aspect)

In the manufacturing method according to the first aspect, the impurity atom in the impurity thin film is recoiled from the inside of the impurity thin film to the inside of the semiconductor substrate by a nock on effect that is caused, at a surface part of the concavity and convexity part of the semiconductor substrate, by collision of the implantation ion to the impurity atom in the impurity thin film in a direction substantially orthogonal to the surface part.

(Eleventh Aspect)

In the manufacturing method according to the second aspect, the ion implantation is performed with low-energy implantation less than 5 keV.

(Twelfth Aspect)

In the manufacturing method according to the second aspect, the ion implantation is performed with low dose implantation atomic weight less than 2E15atoms/cm2.

(Thirteenth Aspect)

In the manufacturing method according to the first aspect, the impurity thin film is thickly deposited on a plane part of the surface except for the concavity and convexity part of the semiconductor substrate.

(Fourteenth Aspect)

In the manufacturing method according to any one of the fourth through sixth aspects, the impurity thin film is thickly deposited on a plane part of the semiconductor substrate by increasing a deposit rate of the impurity thin film deposited on the plane part with the plasma treatment while by decreasing, relative to that for the plane part, a deposit rate of the impurity thin film deposited on a side surface of the concavity and convexity part.

According to the present invention, it is possible to dope a carrier impurity atom of high concentration with high time efficiency, the normal ion implantation process time, and low energy, relative to the conventional ion implantation process which needs the long processing time caused by the low-energy.

Thus, it is possible to dope impurities, with high efficiency, to a part which is not a plane of a semiconductor substrate, namely, to a wall surface part of a concavity and convexity part formed by processing on the semiconductor substrate surface.

DESCRIPTION OF THE PREFERRED EMBODIMENTS

Referring to FIGS. 1A to 1D, the description will be made in regard to an ion implantation process flow in case where an ion implantation target part is a plane, namely, a flat surface.

FIGS. 1A to 1D show the ion implantation process flow to a plane part of a semiconductor substrate. In FIGS. 1A to 1D, 11 is a silicon substrate as the semiconductor substrate, 12 is a plasma that B2H6 gas was introduced, 13 is a deposited film including B (Boron), 14 is a Ge (Germanium) ion beam. After irradiation of the ion beam 14, spike anneal (lamp anneal, laser anneal, RTP anneal, or the like) of 1050° C. is performed.

The operation will be described below.

Figure 1A:
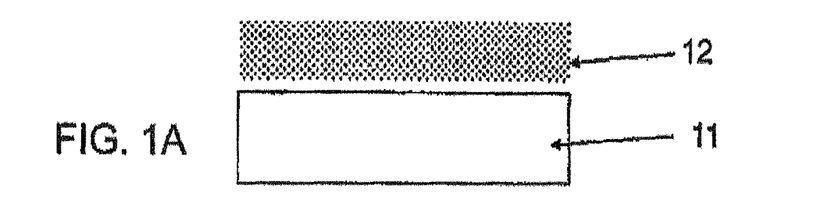
FIGS. 1A to 1D are diagrams which show an ion implantation process flow.
Figure 1B:
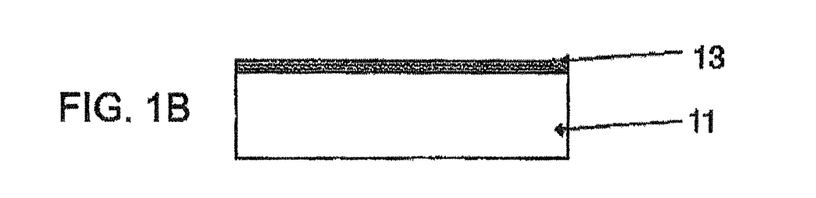
Figure 1C:
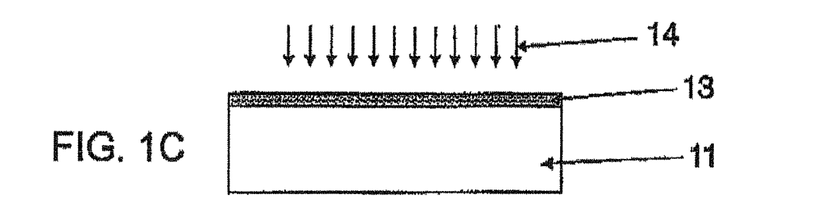
Figure 1D:
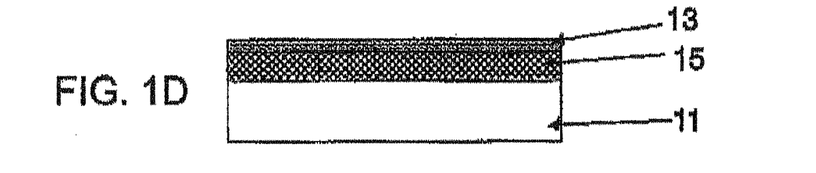

At first, based on a gas including B2H6 as a basic gas, plasma is formed above the silicon substrate 11 placed in a chamber (not shown). Then a deposited film 13 including B is formed in thickness of around 5 nm (preferably several nm to several dozen nm) on the surface of the silicon substrate 11 by the plasma 12 (FIGS. 1A and 1B). The deposited film 13 is a thin film having a B concentration of 50% to 99%. When Ge ions which are large in mass than B (large in atomic weight) are implanted with 1E14atoms/cm2 and the beam energy 5 keV by a Ge ion beam 14 (FIG. 1C), the Ge ions collide with B and, as a result, B is flicked. With the energy given by the collision, a B layer is introduced within the silicon substrate 11 with around 1E15atoms/cm2 as an impurity diffused layer 15 (FIG. 1D).

According to the ion implantation method mentioned above, it is possible to form the B layer (impurity diffused layer 15) of high concentration with the dose amount which is low by one digit or more by performing the ion implantation through the thin film after depositing the thin film including the impurity atom on the surface of the semiconductor substrate. That is it is possible to perform doping in high productivity and in short processing time.

Referring to FIGS. 2A to 2D, the description will be made with respect to a first embodiment of this invention.

The first embodiment of this invention is an application that, in FIGS. 2A to 2D, the silicon substrate 11 has a step by forming a concavity and convexity part, herein a projection (extension) part, on the surface of the silicon substrate 11 with the processing, such as etching or the like. In addition, as for the concavity and convexity part, a space structure having a ditch, a step, a slope or the like is supposed in addition to the projection part.

Figure 2A:
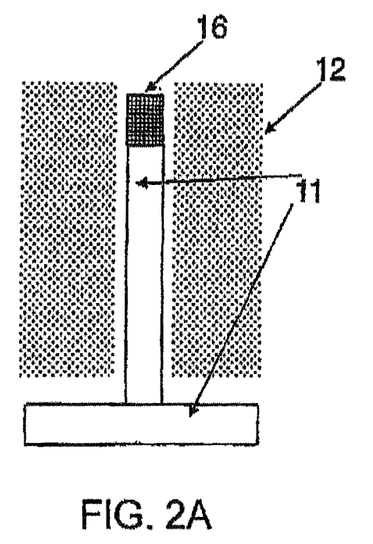
FIGS. 2A to 2D are diagrams which show a process flow in a first embodiment of the present invention.
Figure 2B:
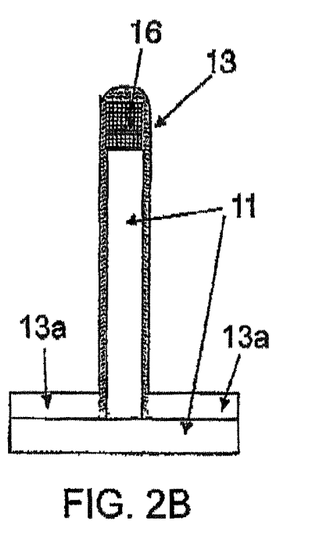

With the plasma 12 in similar to FIGS. 1A to 1D, the deposited film 13 including B is formed to both sidewalls of the step of a Fin (projection part) formed on the silicon substrate 11 by etching process using a hard mask 16 (FIGS. 2A and 2B). At this time, it is configured so that a deposit rate of the deposited film deposited on a plane part of the substrate with the plasma treatment is large while a deposit rate of the deposited film deposited on the side wall of the Fin becomes small relative to that for the plane part of the substrate. With this configuration, a deposited film 13a which is larger in thickness than that of the deposited film 13 formed to both side walls of the Fin part is deposited on the plane part of the semiconductor substrate 11 except for the Fin part.

Figure 2C:
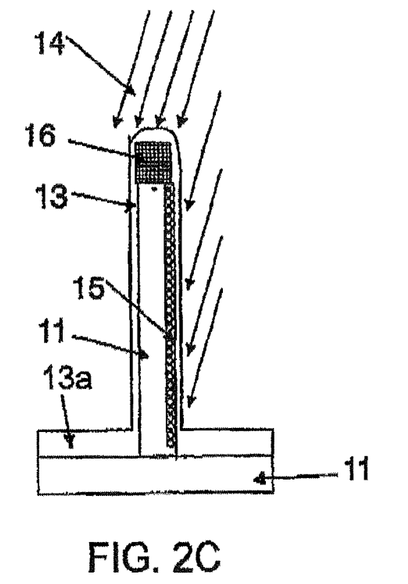
Figure 2D:
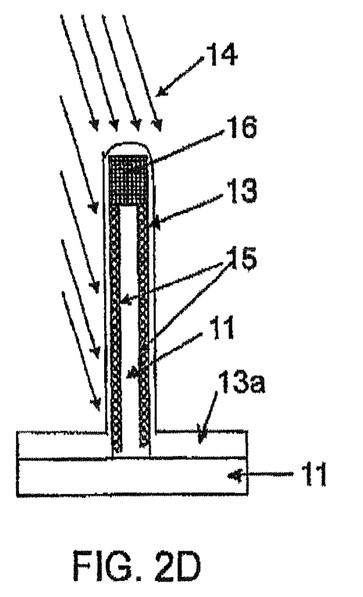

Subsequently, the both sidewalls of the step of the Fin part are irradiated with the Ge ion beam 14 from two diagonal directions. With this irradiation, in the ion implantation of the dose amount of 1E14atoms/cm2 level as the dose amount for the sidewalls, it is possible to form the impurity diffused layer 15 enough and uniform in dose amount for source/drain to the both side walls of the step of the Fin part. In addition, the two directions represent the direction where an implantation angle θ from a perpendicular line for a plane of the silicon substrate 11 is defined with a small inclination angle (an acute angle) substantially equal to or less than 20 degrees. Accordingly, the tow directions are a right diagonal upper direction as shown in FIG. 2C and a left diagonal upper direction as shown in FIG. 2D.

Referring to FIGS. 6A to 6D, the description will be made with respect to a second embodiment of this invention.

In the second embodiment, when a CMOS (Complementary Metal Oxide Semiconductor) is formed, deposited films including P or B are selectively formed to an N-type device region and a P-type device region, respectively. Then, it is possible to form extension regions of N-type MOSFET and P-type MOSFET with a single mask alignment.

Although a Fin part (projection part) for forming a source and a Fin part (projection part) for forming a drain are formed with the etching process or the like, in FIGS. 6A to 6D, for convenience, the Fin part (projection part) for forming the source and the Fin part (projection part) for forming the drain are separately illustrated each other. This is to illustrate a cross section surface of a source part and a cross section surface of a drain part with a single drawing since the source part and the drain part are formed so as to line up on a straight line as apparent from FIG. 10.

Figure 6A:
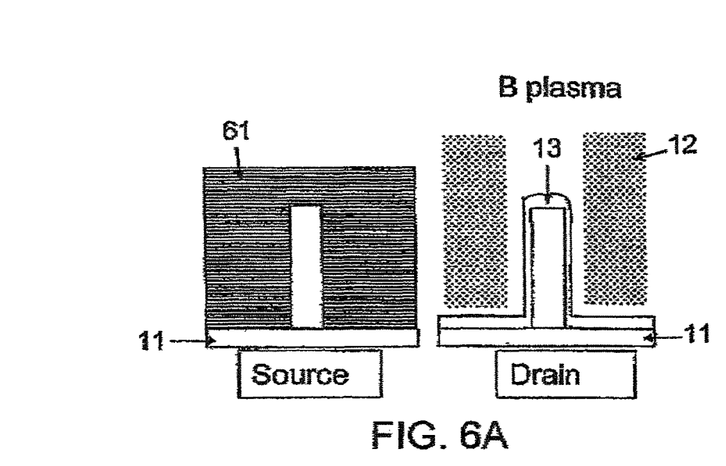
FIGS. 6A to 6D are diagrams which show a process flow in a second embodiment of the present invention.

In a process of FIG. 6A, as well as FIG. 2A, with the state that the Fin part which becomes the source part is covered with a resist 61, the deposited film 13 including B is formed on the surface of the Fin part which becomes the drain part by the plasma 12.

Figure 6B:
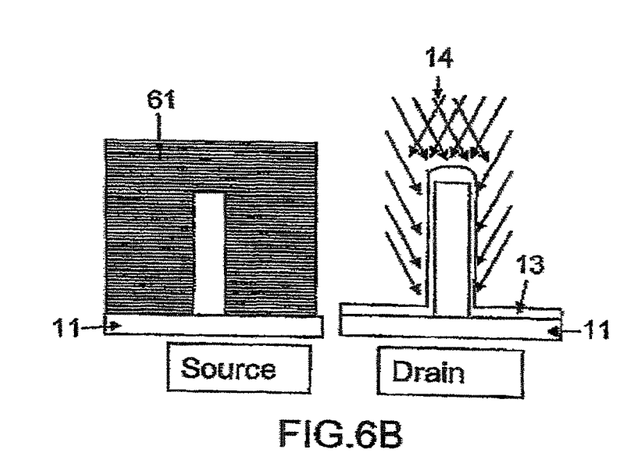

Then, in a process of FIG. 6B, with the state that the Fin part which becomes the source part is covered with a resist 61, both sidewalls of the Fin part of the drain part side are irradiated with the Ge ion beam 14 from the right upper direction and the left upper direction.

Figure 6C:
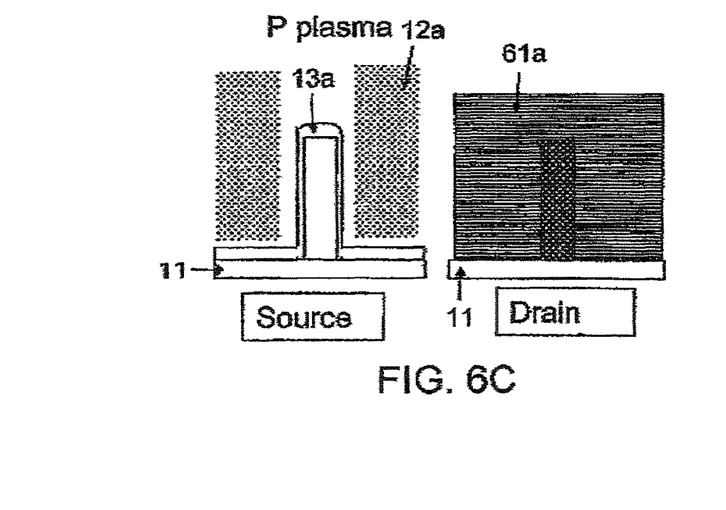

In a process of FIG. 6C, the deposited film 13 of the drain part side is removed and then the Fin part which becomes the drain part is covered with a resist 61a. In this state, as well as FIG. 2A, the deposited film 13a including P is formed on the surface of the Fin part which becomes the source part by plasma 12a.

Figure 6D:
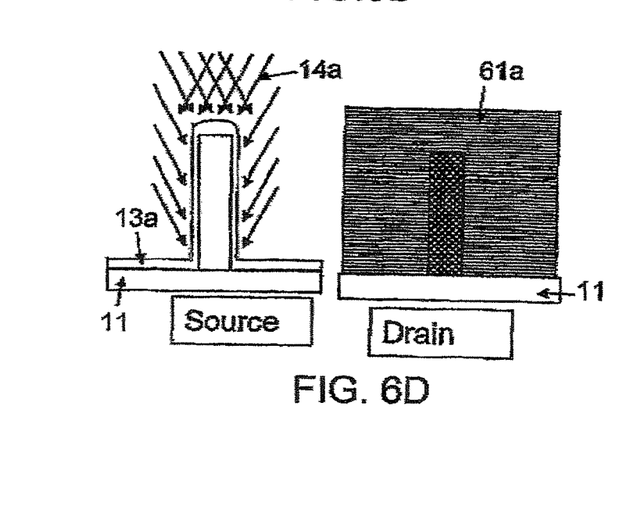

Then, in a process of FIG. 6D, with the state that the Fin part which becomes the drain part is covered with the resist 61, both sidewalls of the Fin part of the source part side are irradiated with the Ge ion beam 14 from the right upper direction and the left upper direction. Subsequently, the deposited film 13a of the source part side is removed.

In the conventional method in which the ion implantation is directly performed, since the implantation dose is high, the Fin part becomes amorphous. Therefore there was a problem that a high-density defect is caused, because the crystal growth is not occurred from the substrate side.

Figure 7:
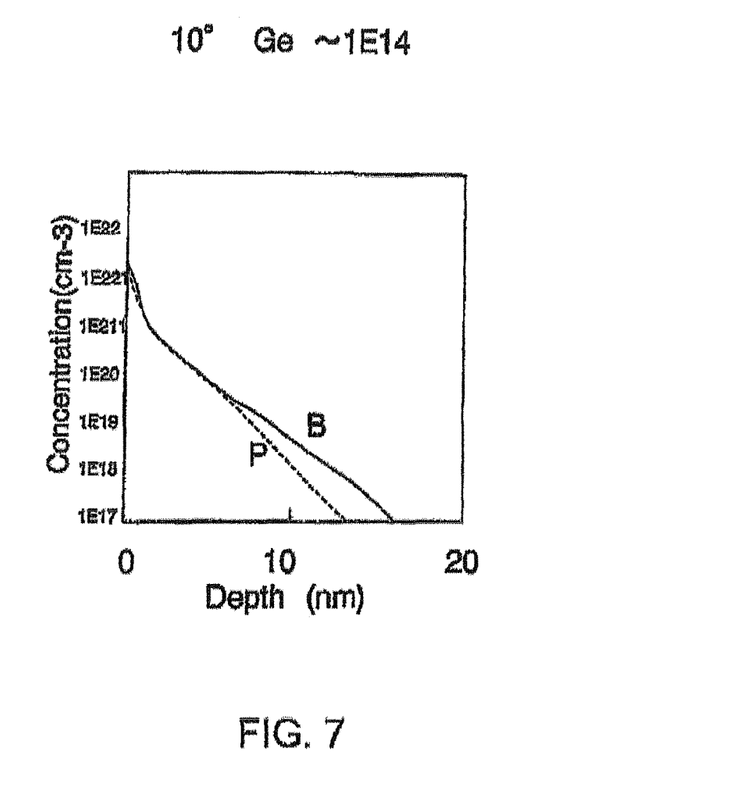
FIG. 7 is a graphical drawing showing a depth-concentration profile in a wall corresponding to a sidewall of a projection which was actually treated by the embodiment of the present invention.

FIG. 7 shows a depth-concentration profile in a well corresponding to a sidewall of the Fin part which was actually treated by the embodiment of the present invention. A solid line of FIG. 7 shows the concentration of B while a dashed line shows a depth distribution of the concentration of P.

Figure 8:
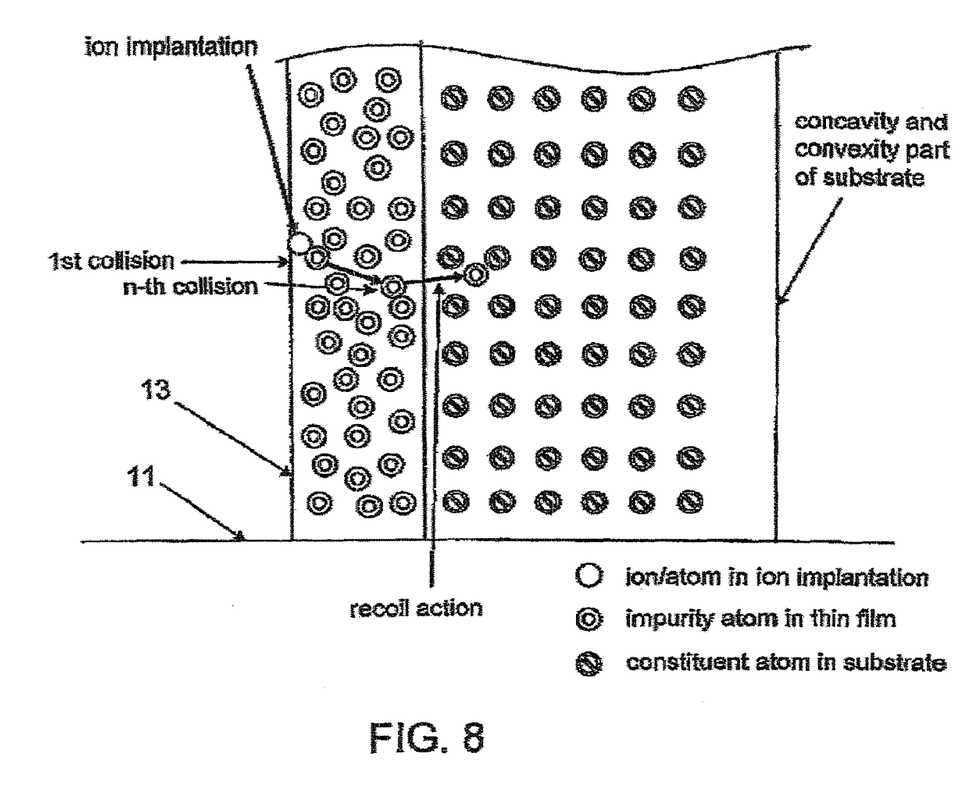
FIG. 8 is a diagram for explaining a recoil action.
Figure 9:
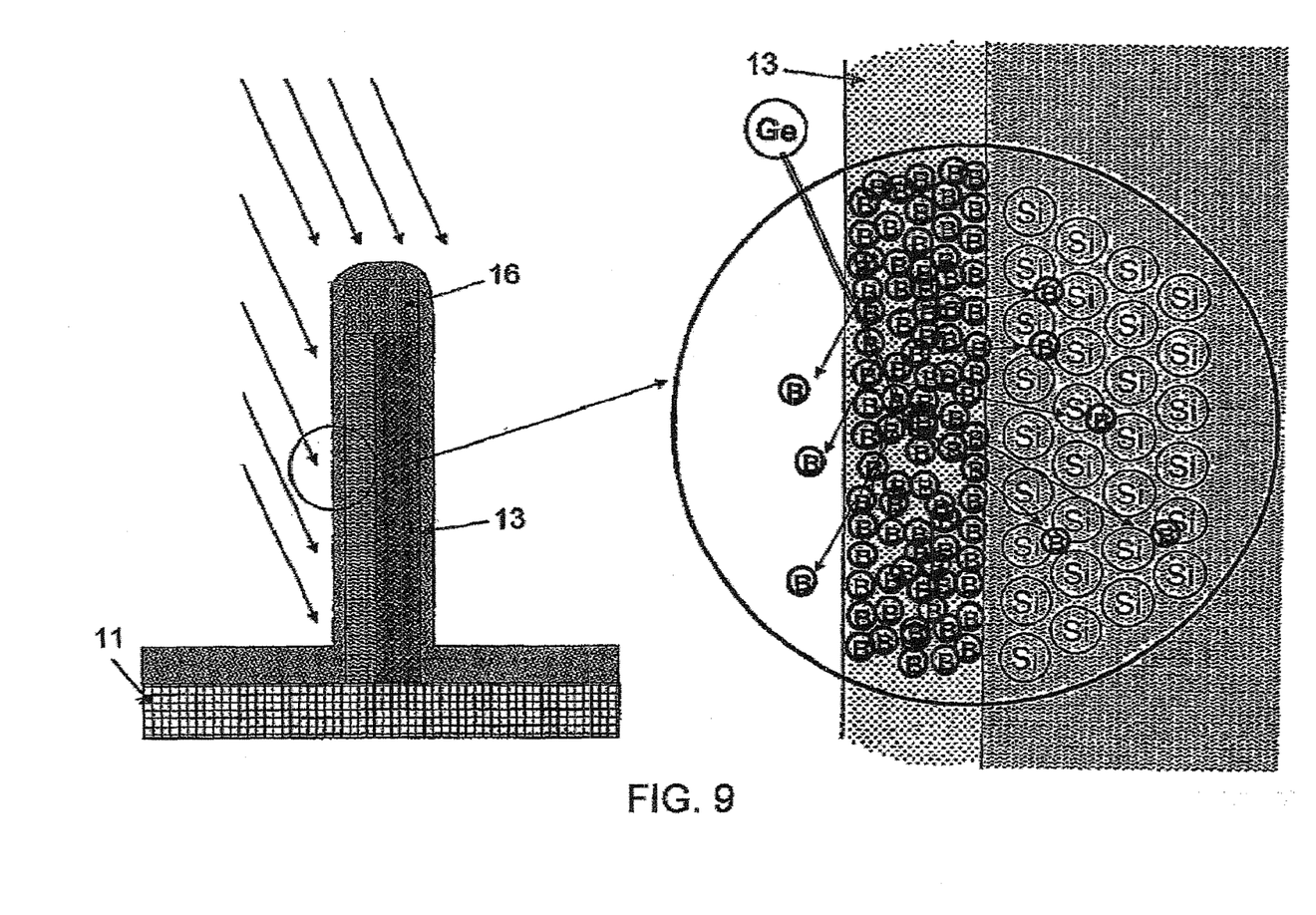
FIG. 9 is an enlarged diagram which shows the recoil action of FIG. 8.

FIGS. 8 and 9 are diagrams for explaining the recoil action according to the embodiment of this invention.

In FIG. 8, the impurity atom B in the deposited film 13 that is formed to the surface part of the Fin part of the silicon substrate 11 is recoiled from the inside of the deposited film 13 to the inside of the Fin part of the semiconductor substrate 11 by a nook on effect that is caused by collision of the implantation ion to the impurity atom B in the deposited film 13 in a direction substantially orthogonal to the surface of the sidewall of the Fin part (substantially perpendicular direction).

In general, when particles (atom/ion) accelerated at high speed are implanted into the substance of a solid or liquid material, the energy of the particles decreases gradually as the particles colliding with atoms constituting the material. Finally, the particles stop, when the energy of the implantation particles decreases to the energy that is smaller than the potential energy that the material produces. In this time duration, in an energy range utilized in a usual ion implantation, several dozen to several thousand atoms in the material are received with the energy.

FIG. 8 shows a movement of one colliding-particle to make it easy to understand the recoil action based on the principle mentioned above. However, in reality, as shown in FIG. 9 with an enlarged diagram, multiple and multistage collisions (first through n-th collision) are occurred in the inside of the deposited film 13.

Especially, when the mass of the colliding-particle is heavier in weight than that of the atom constituting the material of the deposited film, it is possible to give the energy to the more atoms constituting the material. In this case, quite a number of purpose impurity atoms more than the incident particles can be introduced within the semiconductor substrate.

Furthermore, since the energy of the implantation ion can be set higher than the energy given to the purpose impurity atoms, the space-charge effect is suppressed lower than a case of the direct implantation, and it is possible to set the high beam current.

Therefore, even if the implantation angle is low, it is possible to prevent the degradation of the productivity. According to the condition, it can be hoped that the productivity becomes higher than a case that the purpose impurity atomic ion is directly implanted into the plane. As a result, it can be hoped that the present invention can contribute to solve the problems mentioned before.

Effect of the Embodiment

According to the embodiments of the present invention, by the formation of the deposited thin film with the plasma end by the recoil action (knock on effect) caused by the ion implantation, B or P ion of around 1E15atoms/cm2 is introduced in the semiconductor substrate with a shallow depth and with low dose amount less than 1/10 relative to the normal case. That is it is possible to provide the doping method that the impurity atom of high concentration can be introduced into in the semiconductor substrate with low dose mount. Especially, it is possible to implant the ion into the wall part of the space structure by the knock on effect.

While the present invention has been particularly shown and described with reference to exemplary embodiments thereof, the present invention is not limited to these embodiments. It will be understood by those of ordinary skill in the art that various changes in form and details may be made therein without departing from the sprit and scope of the present invention as defined by the claims.

For example, the solid material which becomes the base substrate of the semiconductor device is a solid silicon (silicon: single crystal or polycrystalline), GaAs, Ge, SiC, a compound semiconductor or the like.

In addition, it is desirable that a recoil condition, namely, the energy (depth profile corresponding to an implantation depth) for the ion implantation of the impurities of the impurity thin film or a dose atomic weight corresponding to an implantation dose amount is controlled by an adjustment of a film thickness of the impurity thin film (deposited film) or a species of an impurity deposition material of the impurity thin film, or an adjustment of an implantation ion species, an implantation angle, an implantation energy, and an implantation dose amount.

In this case, it is desirable that a condition of non-implantation is adjusted by adjusting a film thickness of the impurity thin film, a species of the impurity deposition material, an implantation ion species, an implantation angle, an implantation energy, and an implantation dose amount so that the implantation ion itself remains in the impurity thin film without being almost introduced into a concavity and convexity part formed by the processing of the semiconductor substrate.

For the impurity atom of the impurity thin film, As may be used other than B and P.

As a gas which is used to deposit the impurity thin film including B with the plasma treatment, a gas including BF3 may be used in place of diborane B2H6.

On the other hand, there is a gas including phosphine PH3 as a favorable example of the gas which is used to deposit the impurity thin film including P with the plasma treatment.

In addition, there is a gas including arsine AsH3 as a favorable example of the gas which is used to deposit the impurity thin film including As with the plasma treatment.

For the implantation ion in the ion implantation process, it can use any one of Si, As, Ge, In, Sb, Xe, and Ar.

In addition, the following process may be adopted. After the formation of a deposited film including B to the semiconductor substrate with a plasma treatment by the use of B2H6, covers the whole of the surface of the semiconductor substrate with a resist protective film and then removes the resist protective film selectively so as to expose a part of the surface of the semiconductor substrate wherein the resist protective film was removed. Subsequently, removes the deposited film including B of a part corresponding to an exposed part and then forms a deposited film including P to a removed part with a plasma treatment by the use of PH3. After removing the whole of the resist protective film, any one ion of Ge, Si, As, In, Sb, Xe, and Ar is implanted to the whole of the surface of the semiconductor substrate.

What is claimed is:

1. A manufacturing method of a semiconductor device comprising;
    preparing a semiconductor substrate which is a base substrate of the semiconductor device and which is formed with a concavity and convexity part on the surface of the semiconductor substrate;
    depositing on the surface of said semiconductor substrate an impurity thin film including an impurity atom which becomes a donor or an acceptor in the semiconductor substrate;
    performing an ion implantation from a diagonal upper direction to the impurity thin film deposited on the concavity and convexity part of said semiconductor substrate; and
    recoiling the impurity atom from the inside of the impurity thin film to the inside of the concavity and convexity part of said semiconductor substrate by performing said ion implantation;
    wherein the impurity atom in said impurity thin film is recoiled from the inside of said impurity thin film to the inside of said semiconductor substrate by a knock on effect that is caused, at a surface part of the concavity and convexity part of said semiconductor substrate, by collision of the implantation ion to the impurity atom in said impurity thin film in a direction substantially orthogonal to the surface part,
    wherein the impurity thin film is thickly deposited on a plane part of the surface except for the concavity and convexity part of said semiconductor substrate.

2. The manufacturing method according to claim 1, wherein a dose atomic weight corresponding to an implantation dose amount is controlled by an adjustment of a film thickness of the impurity thin film or a species of an impurity deposition material of the impurity thin film, or an adjustment of an implantation ion species, an implantation angle, an implantation energy, and an implantation dose amount.

3. The manufacturing method according to claim 2, wherein a beam incidence angle to the surface of the concavity and convexity part of said semiconductor substrate from the diagonal upper direction in said ion implantation is an inclination angle substantially less than 20 degrees.

4. The manufacturing method according to claim 2, wherein said ion implantation is performed with low-energy implantation less than 5keV.

5. The manufacturing method according to claim 2, wherein said ion implantation is performed with low dose implantation atomic weight less than 2E15atoms/cm2.

6. The manufacturing method according to claim 1, wherein the impurity atom of said impurity thin film is any one of B, P, and As.

7. The manufacturing method according to claim 1, wherein, as said impurity thin film, the impurity thin film including B is deposited by performing a plasma treatment with a gas including diborane B2H6 or BF3.

8. The manufacturing method according to claim 7, wherein the impurity thin film is thickly deposited on a plane part of the semiconductor substrate by increasing a deposit rate of the impurity thin film deposited on said plane part with said plasma treatment while by decreasing, relative to that for the plane part, a deposit rate of the impurity thin film deposited on a side surface of the concavity and convexity part.

9. The manufacturing method according to claim 1, wherein, as said impurity thin film, the impurity thin film including P is deposited by performing a plasma treatment with a gas including phosphine PH3.

10. The manufacturing method according to claim 9, wherein the impurity thin film is thickly deposited on a plane part of the semiconductor substrate by increasing a deposit rate of the impurity thin film deposited on said plane part with said plasma treatment while by decreasing, relative to that for the plane part, a deposit rate of the impurity thin film deposited on a side surface of the concavity and convexity part.

11. The manufacturing method according to claim 1, wherein, as said impurity thin film, the impurity thin film including As is deposited by performing a plasma treatment with a gas including arsine AsH3.

12. The manufacturing method according to claim 11, wherein the impurity thin film is thickly deposited on a plane part of the semiconductor substrate by increasing a deposit rate of the impurity thin film deposited on said plane part with said plasma treatment while by decreasing, relative to that for the plane part, a deposit rate of the impurity thin film deposited on a side surface of the concavity and convexity part.

13. The manufacturing method according to claim 1, wherein an implantation ion in the ion implantation process is the ion of a heavy atom which is larger in atomic weight than any one of B, P, and As which constitute the impurity atom of said impurity thin film.

14. The manufacturing method according to claim 1, wherein an implantation ion in the ion implantation process is any one of Si, As, Ge, In, Sb, Xe, and Ar.

* * * * *